(12) United States Patent
Falk et al.

(10) Patent No.: US 10,676,862 B2
(45) Date of Patent: Jun. 9, 2020

(54) TEXTILES INCLUDING CARBON NANOTUBES

(71) Applicant: INTERNATIONAL BUSINESS MACHINES CORPORATION, Armonk, NY (US)

(72) Inventors: Abram L. Falk, Port Chester, NY (US); Shu-Jen Han, Cortlandt Manor, NY (US); Bharat Kumar, Tarrytown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/401,433

(22) Filed: May 2, 2019

(65) Prior Publication Data
US 2019/0259953 A1  Aug. 22, 2019

Related U.S. Application Data

(63) Continuation of application No. 15/496,486, filed on Apr. 25, 2017, now Pat. No. 10,370,790.

(51) Int. Cl.
*H01L 51/00* (2006.01)
*D06M 11/73* (2006.01)
(Continued)

(52) U.S. Cl.
CPC ............ *D06M 11/73* (2013.01); *B32B 5/024* (2013.01); *B32B 5/06* (2013.01); *B32B 5/26* (2013.01); *D06M 11/74* (2013.01); *D06M 11/83* (2013.01); *D06M 23/08* (2013.01); *H01G 11/36* (2013.01); *H01L 51/0048* (2013.01); *B32B 2250/02* (2013.01); *B32B 2250/20* (2013.01);
(Continued)

(58) Field of Classification Search
CPC ...................................................... H01L 51/00
See application file for complete search history.

(56) References Cited

U.S. PATENT DOCUMENTS

| | | | |
|---|---|---|---|
| 7,354,877 B2 | 4/2008 | Rosenberger et al. | |
| 8,325,079 B2 | 12/2012 | Shah et al. | |

(Continued)

FOREIGN PATENT DOCUMENTS

| | | |
|---|---|---|
| CN | 104538201 | 4/2015 |
| CN | 105040426 | 11/2015 |

(Continued)

OTHER PUBLICATIONS

Gao, Junbo, et al. "Continuous spinning of a single-walled carbon nanotube-nylon composite fiber." Journal of the American Chemical Society 127.11 (2005): 3847-3854.

(Continued)

*Primary Examiner* — Andrew T Piziali
(74) *Attorney, Agent, or Firm* — F. Chau & Associates, LLC

(57) ABSTRACT

A textile article includes a first fabric including a plurality of first carbon nanotubes coupled to the first fabric. The first carbon nanotubes of the plurality of first carbon nanotubes are metallic carbon nanotubes. A second fabric includes a plurality of second carbon nanotubes coupled to the second fabric. The second carbon nanotubes of the plurality of second carbon nanotubes are semiconductive carbon nanotubes. The first fabric is interconnected with the second fabric.

11 Claims, 8 Drawing Sheets

(51) Int. Cl.

| | | |
|---|---|---|
| *B32B 5/02* | (2006.01) | |
| *B32B 5/26* | (2006.01) | |
| *B32B 5/06* | (2006.01) | |
| *D06M 11/83* | (2006.01) | |
| *H01G 11/36* | (2013.01) | |
| *D06M 11/74* | (2006.01) | |
| *D06M 23/08* | (2006.01) | |
| *D06M 101/06* | (2006.01) | |
| *D06M 101/34* | (2006.01) | |
| *H01L 51/44* | (2006.01) | |
| *H01L 51/05* | (2006.01) | |
| *H01L 51/10* | (2006.01) | |
| *D06M 101/12* | (2006.01) | |
| *D06M 101/32* | (2006.01) | |
| *D06M 101/40* | (2006.01) | |

(52) U.S. Cl.
CPC . *B32B 2262/0261* (2013.01); *B32B 2262/062* (2013.01); *B32B 2262/103* (2013.01); *B32B 2262/106* (2013.01); *B32B 2307/202* (2013.01); *B32B 2307/51* (2013.01); *B32B 2437/00* (2013.01); *B32B 2457/14* (2013.01); *B32B 2457/16* (2013.01); *D06M 2101/06* (2013.01); *D06M 2101/12* (2013.01); *D06M 2101/32* (2013.01); *D06M 2101/34* (2013.01); *D06M 2101/40* (2013.01); *H01L 51/0558* (2013.01); *H01L 51/102* (2013.01); *H01L 51/105* (2013.01); *H01L 51/441* (2013.01)

(56) References Cited

U.S. PATENT DOCUMENTS

| | | | |
|---|---|---|---|
| 8,405,058 | B2 | 3/2013 | Slinkard et al. |
| 8,495,946 | B2 | 7/2013 | Jackson et al. |
| 8,780,526 | B2 | 7/2014 | Fleischer et al. |
| 8,787,001 | B2 | 7/2014 | Fleischer et al. |
| 2004/0053780 | A1 | 3/2004 | Jiang et al. |
| 2009/0184389 | A1 | 7/2009 | Bertin et al. |
| 2009/0282908 | A1 | 11/2009 | Homayoun et al. |
| 2011/0126335 | A1 | 6/2011 | Schultz |
| 2011/0151254 | A1 | 6/2011 | Fugetsu et al. |
| 2018/0305857 | A1 | 10/2018 | Falk et al. |

FOREIGN PATENT DOCUMENTS

| | | |
|---|---|---|
| CN | 105047927 | 11/2015 |
| CN | 105244183 | 1/2016 |
| EP | 1932805 | 6/2008 |
| IN | 2141MUM2011 A | 2/2013 |
| KR | 101597176 | 2/2016 |
| WO | 2002055769 | 7/2002 |
| WO | 2003004741 | 1/2003 |
| WO | 2011063261 | 5/2011 |

OTHER PUBLICATIONS

Haniff, Muhammad Aniq Shazni Mohammad, et al. "Highly sensitive integrated pressure sensor with horizontally oriented carbon nanotube network." Nanoscale research letters 9.1 (2014): 49.

Kong, Jing, et al. "Nanotube molecular wires as chemical sensors." science 287.5453 (2000): 622-625.

Zhu, Jiang, et al. "Improving the dispersion and integration of single-walled carbon nanotubes in epoxy composites through functionalization," Nano letters 3.8 (2003): 1107-1113.

TEXTILES INCLUDING CARBON NANOTUBES

CROSS REFERENCE TO RELATED APPLICATION

This Applicant is a continuation of U.S. application Ser. No. 15/496,486 filed on Apr. 25, 2017, in the U.S. Patent and Trademark Office, the contents of which are herein incorporated by reference in their entirety.

BACKGROUND

The present invention generally relates to textiles, and more particularly to textiles including carbon nanotubes.

Carbon nanotubes are tube-shaped materials including carbon and having a cylindrical structure. A diameter of a carbon nanotube may be measured, for example, on a nanometer scale. Carbon nanotubes may be used in nanotechnology, electronics, optics and other related fields. Carbon nanotubes may include metallic and semiconducting nanotubes. Semiconducting nanotubes may be distinguished from metallic nanotubes based on chirality.

Carbon nanotubes may be electrically conductive, thermally conductive and may be relatively durable materials. For example, carbon nanotubes may be structurally stable, even with relatively high length-to-diameter ratios. Semiconducting nanotubes may be relatively responsive to their environment (e.g., by a change in the number of free charges in the semiconducting nanotubes), and metallic nanotubes may have relatively high charge densities and may thus carry relatively high currents across relatively long distances.

Carbon nanotubes may be incorporated into wearable fabrics, which may be referred to as 'smart' fabrics.

As an example, a fabric may be exposed to a solution including carbon nanotubes. A portion of the carbon nanotubes in the solution of carbon nanotubes may be incorporated into the fabric. Thus, at least a portion of the fabric including the carbon nanotubes may become electrically conductive, and responsive to a signal applied to the fabric.

SUMMARY

A textile article according to an exemplary embodiment of the present invention includes a first fabric including a plurality of first carbon nanotubes coupled to the first fabric. The first carbon nanotubes of the plurality of first carbon nanotubes are metallic carbon nanotubes. A second fabric includes a plurality of second carbon nanotubes coupled to the second fabric. The second carbon nanotubes of the plurality of second carbon nanotubes are semiconductive carbon nanotubes. The first fabric is interconnected with the second fabric.

A textile article according to an exemplary embodiment of the present invention includes a first fabric including a plurality of first carbon nanotubes coupled to the first fabric. A second fabric includes a plurality of second carbon nanotubes coupled to the second fabric. The second carbon nanotubes have an electrical conductivity different from that of the first carbon nanotubes. The first fabric is interconnected with the second fabric.

A textile article according to an exemplary embodiment of the present invention includes a first fabric including a first yarn. The first yarn includes a plurality of first carbon nanotubes having a first electrical conductivity coupled to the first yarn through van der waals forces. A second fabric includes a second yarn. The second yarn includes a plurality of second carbon nanotubes having a second electrical conductivity coupled to the second yarn through van der waals forces. The first electrical conductivity of the first carbon nanotubes is different from the second electrical conductivity of the second carbon nanotubes. The first fabric is interconnected with the second fabric.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
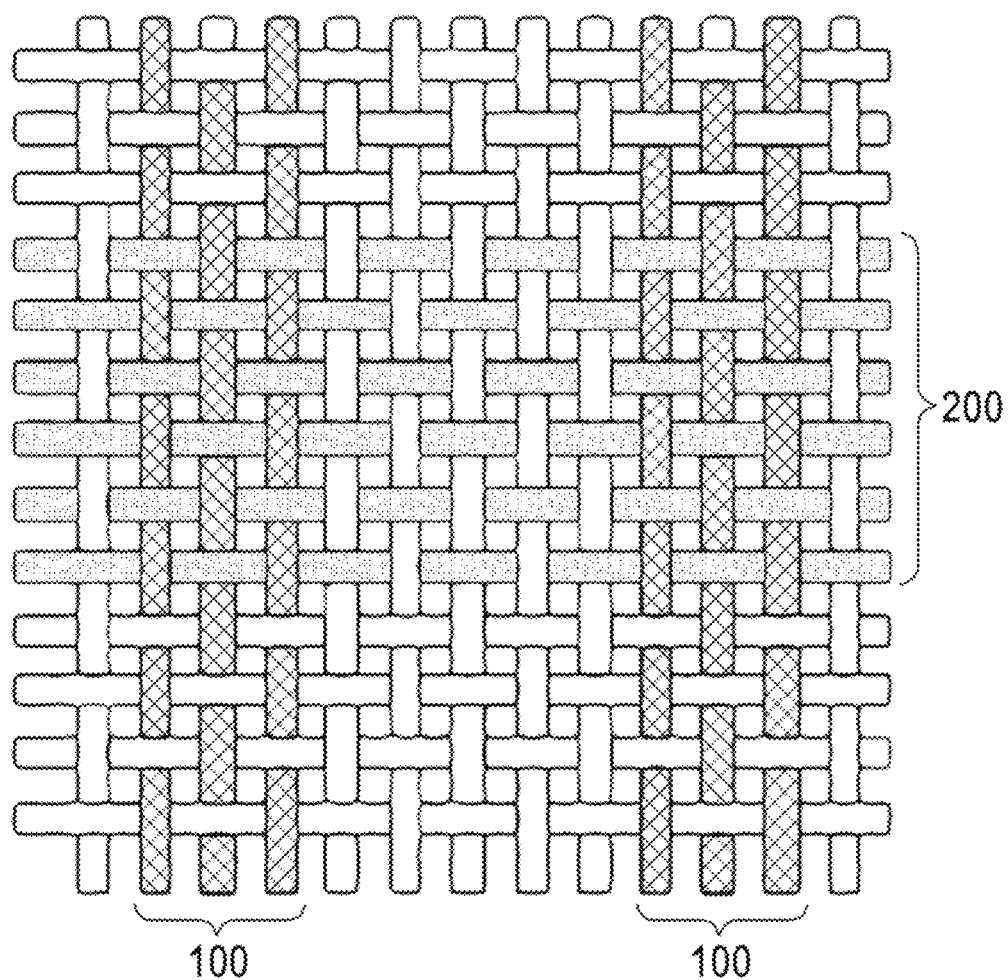
FIG. 1 illustrates a textile article including carbon nanotubes according to an exemplary embodiment of the present invention.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Exemplary embodiments of the present invention will be described more fully hereinafter with reference to the accompanying drawings. Like reference numerals may refer to like elements throughout the specification and drawings.

The terms "nanotubes" and "carbon nanotubes" may be used interchangeably herein. The term "carbon nanotube" may be abbreviated as "CNT," as desired.

Figure 2:
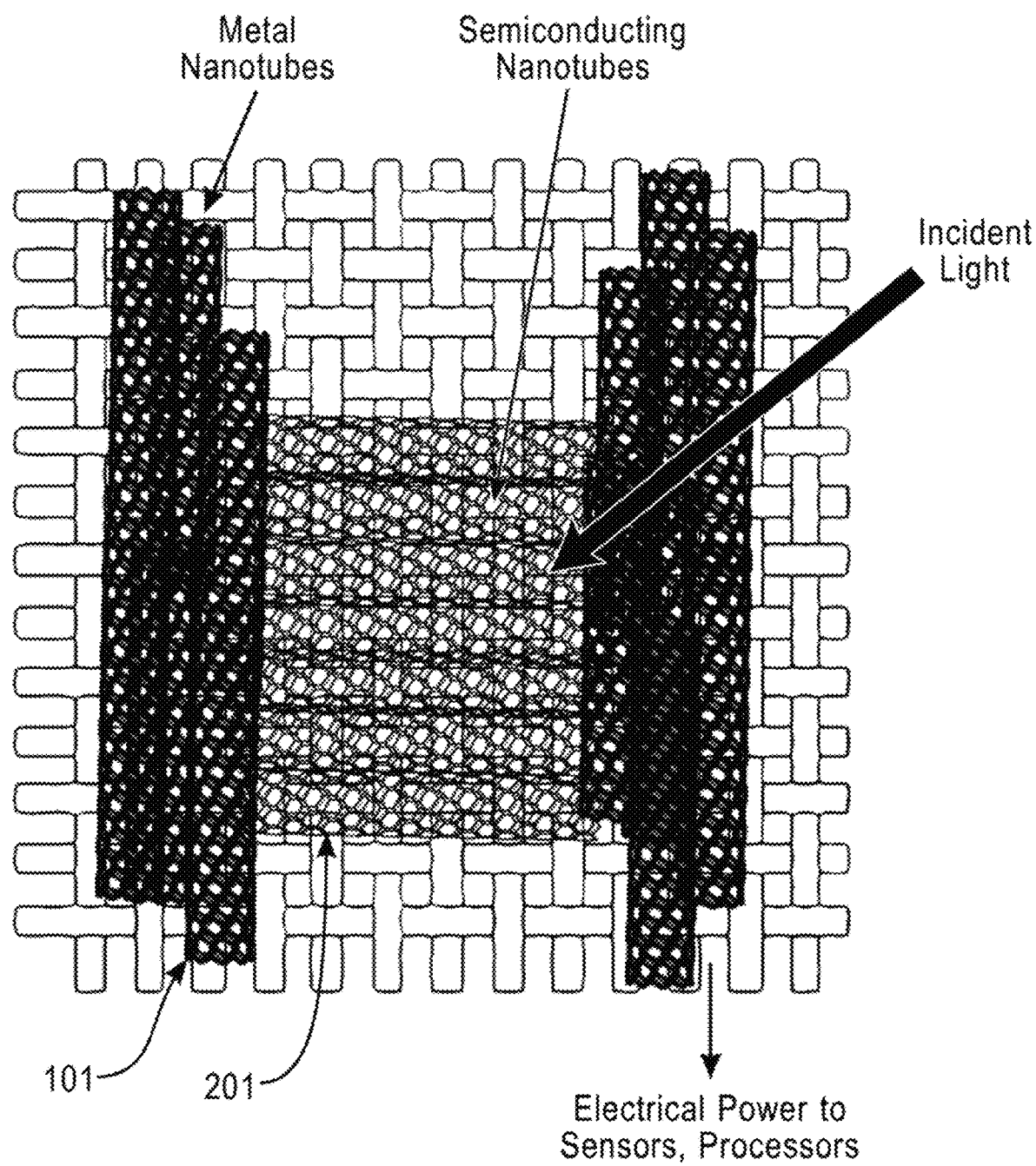
FIG. 2 is a conceptual diagram of a textile article including a photovoltaic cell formed of carbon nanotubes according to an exemplary embodiment of the present invention.

FIG. 1 illustrates a textile article including carbon nanotubes according to an exemplary embodiment of the present invention. FIG. 2 is a conceptual diagram of a textile article including a photovoltaic cell formed of carbon nanotubes according to an exemplary embodiment of the present invention.

Referring to FIGS. 1 and 2, according to an exemplary embodiment of the present invention, a textile article may include a first fabric 100 including a plurality of first carbon nanotubes 101 coupled to the first fabric 100. A second fabric 200 may include a plurality of second carbon nanotubes 201 coupled to the second fabric 200. The second carbon nanotubes 201 may have an electrical conductivity different from that of the first carbon nanotubes 201. The first fabric 100 may be interconnected with the second fabric 200.

Referring to FIGS. 1 and 2, according to an exemplary embodiment of the present invention, a textile article may include a first fabric 100 including a plurality of first carbon nanotubes 101 coupled to the first fabric 100. The first carbon nanotubes of the plurality of first carbon nanotubes 101 may be metallic carbon nanotubes. A second fabric 200 may include a plurality of second carbon nanotubes 201 coupled to the second fabric 200. The second carbon nanotubes of the plurality of second carbon nanotubes 201 may be semiconductive carbon nanotubes. The first fabric 100 may be interconnected with the second fabric 200.

The first carbon nanotubes of the plurality of first carbon nanotubes 101 may be coupled to the first fabric 100 by van der waals forces. The second carbon nanotubes of the plurality of second carbon nanotubes 201 may be coupled to the second fabric 200 by van der waals forces.

As an example, the first fabric 100 may include a plurality of stands of yarn woven together with a plurality of strands of yarn of the second fabric 200. For example, the first fabric 100 and the second fabric 200 may be woven together to form a single fabric included in a textile article (e.g., the textile article described with reference to FIGS. 1 and 2).

As an example, the first and second fabrics 100 and 200 may each include at least one of cotton, silk, nylon, rayon, or polyester. The first and second interconnected fabrics 100 and 200 may form a stretchable fabric included in a wearable garment. The wearable garment may be an item of 'smart clothing'. Non-limiting examples of the wearable garment may include a shirt, pants, a hat, a jacket or coat, a scarf, or sporting equipment. However, exemplary embodiments of the present invention are not limited to a particular textile article, and the smart fabric described herein may be used in any desired textile or any desired garment. The terms "smart clothing," "smart garment" and "smart article" and "smart fabric" may be used interchangeably herein.

According to an exemplary embodiment of the present invention, the first fabric 100 including the plurality of first carbon nanotubes 101 coupled to the first fabric 100 may have a sheet resistivity of about 1 MΩ/□ (the symbol "□" as used herein refers to the unit "square"), and the second fabric 200 including the plurality of second carbon nanotubes 201 coupled to the second fabric 200 may have a sheet resistivity of about 12 MΩ/□ (the symbol "□" as used herein refers to the unit "square").

Figure 3:
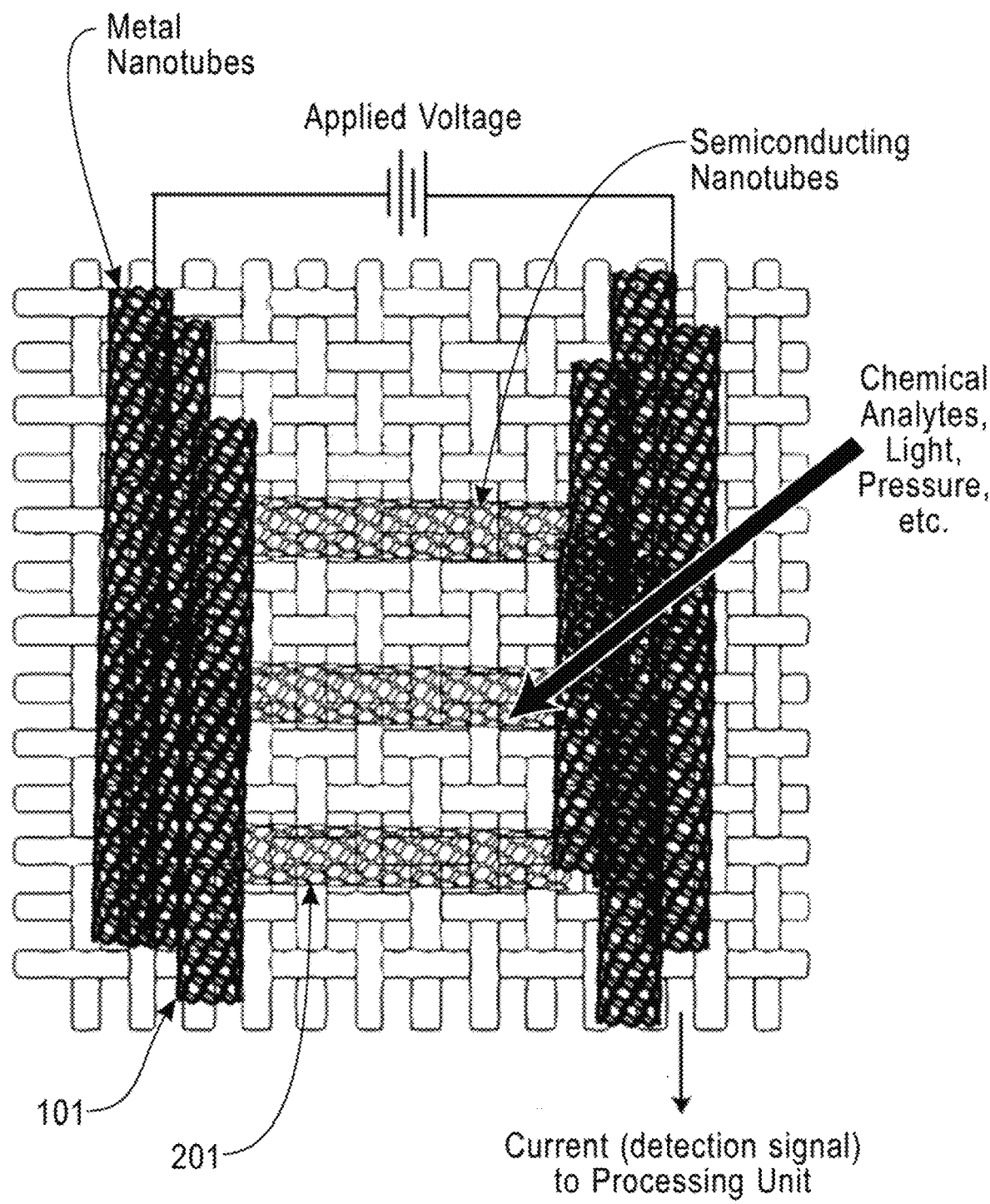
FIG. 3 is a conceptual diagram of a textile article including a sensor formed of carbon nanotubes according to an exemplary embodiment of the present invention.
Figure 4:
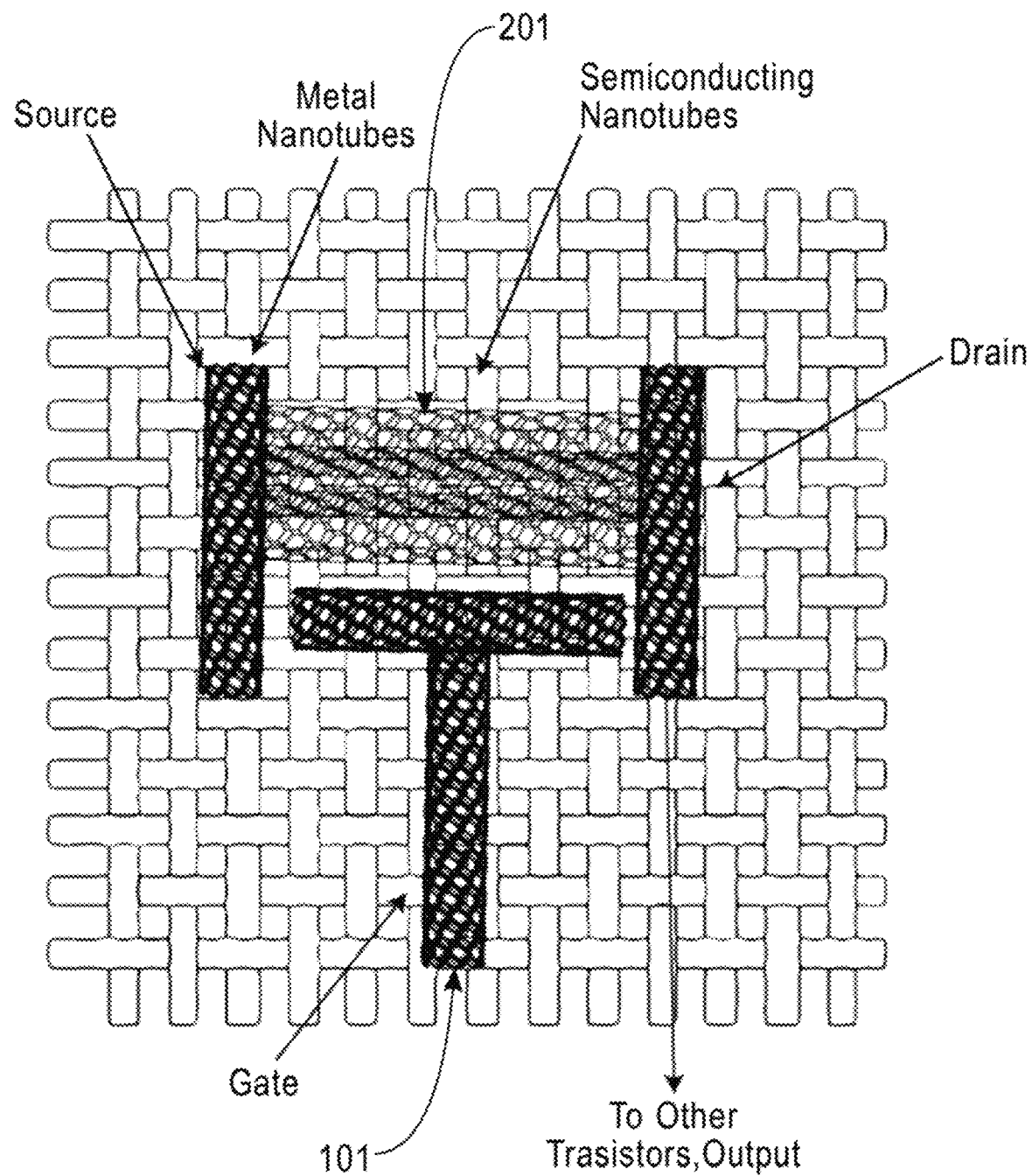
FIG. 4 is a conceptual diagram of a textile article including a transistor formed of carbon nanotubes according to an exemplary embodiment of the present invention.

According to exemplary embodiments of the present invention concept, the interconnected first and second fabrics 100 and 200 may form at least one of a photovoltaic cell, a sensor, a transistor or a capacitor (see, e.g., FIGS. 2, 3 and 4).

FIGS. 2, 3 and 4 are conceptual diagrams and the CNTs illustrated therein are not illustrated to scale. FIGS. 2, 4 and 4 illustrate conceptual diagrams illustrating the relative positions of groups of the first carbon nanotubes 101 with respect to groups of the second carbon nanotubes 201 to form the components described in more detail below (e.g., sensors, transistors and photovoltaic cells). That is, the CNTs described herein are measured on a nanometer scale and are incorporated into the first and second fabrics 100 and 200, as described herein. Further, groups of sensors, transistors and photovoltaic cells may be arranged in a single smart garment to achieve desired results. The photovoltaic cell described in more detail below, for example, may provide power to other electrical components formed using the CNTs described herein.

Referring to FIG. 2, the first fabric 100 including the first carbon nanotubes 101 may be interconnected with (e.g., by weaving) the second fabric 200 including the second carbon nanotubes 201 to form a photovoltaic cell. The photovoltaic cell may include a first plurality of the first CNTs 101 (e.g., metal nanotubes) arranged vertically in a first position, a second first plurality of the first CNTs 101 (e.g., metal nanotubes) arranged vertically in a second positions spaced apart from the first position, and a plurality of the second CNTs 201 (e.g., semiconducting nanotubes) arranged between the first plurality of the first CNTs 101 (e.g., metal nanotubes) and the second plurality of the first CNTs 101 (e.g., metal nanotubes).

The plurality of semiconducting CNTs 201 may absorb incident light and may provide electrical power to one or more sensors, or processors described herein.

According to an exemplary embodiment of the present invention the first fabric 100 including the first carbon nanotubes 101 may be interconnected with (e.g., by weaving) the second fabric 200 including the second carbon nanotubes 201 to form a capacitor or a super capacitor. The capacitor or super capacitor may store an electrical charge collected by the photovoltaic cell, which may provide electrical power to one or more sensors, or processors described herein.

FIG. 3 is a conceptual diagram of a textile article including a sensor formed of carbon nanotubes according to an exemplary embodiment of the present invention.

Referring to FIG. 3, the first fabric 100 including the first carbon nanotubes 101 may be interconnected with (e.g., by weaving) the second fabric 200 including the second carbon nanotubes 201 to form a sensor. The sensor may include a first plurality of the first CNTs 101 (e.g., metal nanotubes) arranged vertically in a first position, a second first plurality of the first CNTs 101 (e.g., metal nanotubes) arranged vertically in a second positions spaced apart from the first position, and a plurality of the second CNTs 201 (e.g., semiconducting nanotubes) arranged between the first plurality of the first CNTs 101 (e.g., metal nanotubes) and the second plurality of the first CNTs 101 (e.g., metal nanotubes). Multiple groups of horizontally arranged second CNTs 201 may be spaced apart from each other along a vertical direction, while being connected between the first and second pluralities of first CNTs 101.

According to an exemplary embodiment of the present invention, a voltage may be applied to each of the first and second pluralities of first CNTs 101.

As a non-limiting example, the sensor (or one or more different sensors) may detect chemical analytes, light, or pressure applied to the smart fabric (e.g., applied to the second fabric 200). A current or detection signal may be applied to a processing unit described below in more detail in response to the sensor detecting the desired stimulus (e.g., the chemical analyte, light or pressure).

FIG. 4 is a conceptual diagram of a textile article including a transistor formed of carbon nanotubes according to an exemplary embodiment of the present invention.

Referring to FIG. 4, the first fabric 100 including the first carbon nanotubes 101 may be interconnected with (e.g., by weaving) the second fabric 200 including the second carbon nanotubes 201 to form a transistor. The transistor may include a first plurality of the first CNTs 101 (e.g., metal nanotubes) arranged vertically in a first position, a second first plurality of the first CNTs 101 (e.g., metal nanotubes) arranged vertically in a second positions spaced apart from the first position, and a plurality of the second CNTs 201 (e.g., semiconducting nanotubes) arranged between the first plurality of the first CNTs 101 (e.g., metal nanotubes) and the second plurality of the first CNTs 101 (e.g., metal nanotubes). A gate may be formed between the between the first plurality of the first CNTs 101 (e.g., metal nanotubes) and the second plurality of the first CNTs 101 (e.g., metal nanotubes). The gate may include a third plurality of the first CNTs 101 (e.g., metal nanotubes). The gate may have a "T" shape; however a vertical portion of the "T" shape may be omitted. Thus, the gate may include the third plurality of the first CNTs 101 (e.g., metal nanotubes) arranged along the horizontal direction between the first plurality of the first CNTs 101 (e.g., metal nanotubes) and the second plurality of the first CNTs 101 (e.g., metal nanotubes).

The transistor may include a source including the first plurality of the first CNTs 101 (e.g., metal nanotubes) and a drain including the second plurality of the first CNTs 101 (e.g., metal nanotubes). A signal may be output to other transistors of the smart garment.

A layout of electrical components of a wearable smart device including one or more sensors, one or more transistors and one or more power sources (e.g., photovoltaic cells) will be described in more detail below with reference to FIG. 6.

Figure 5:
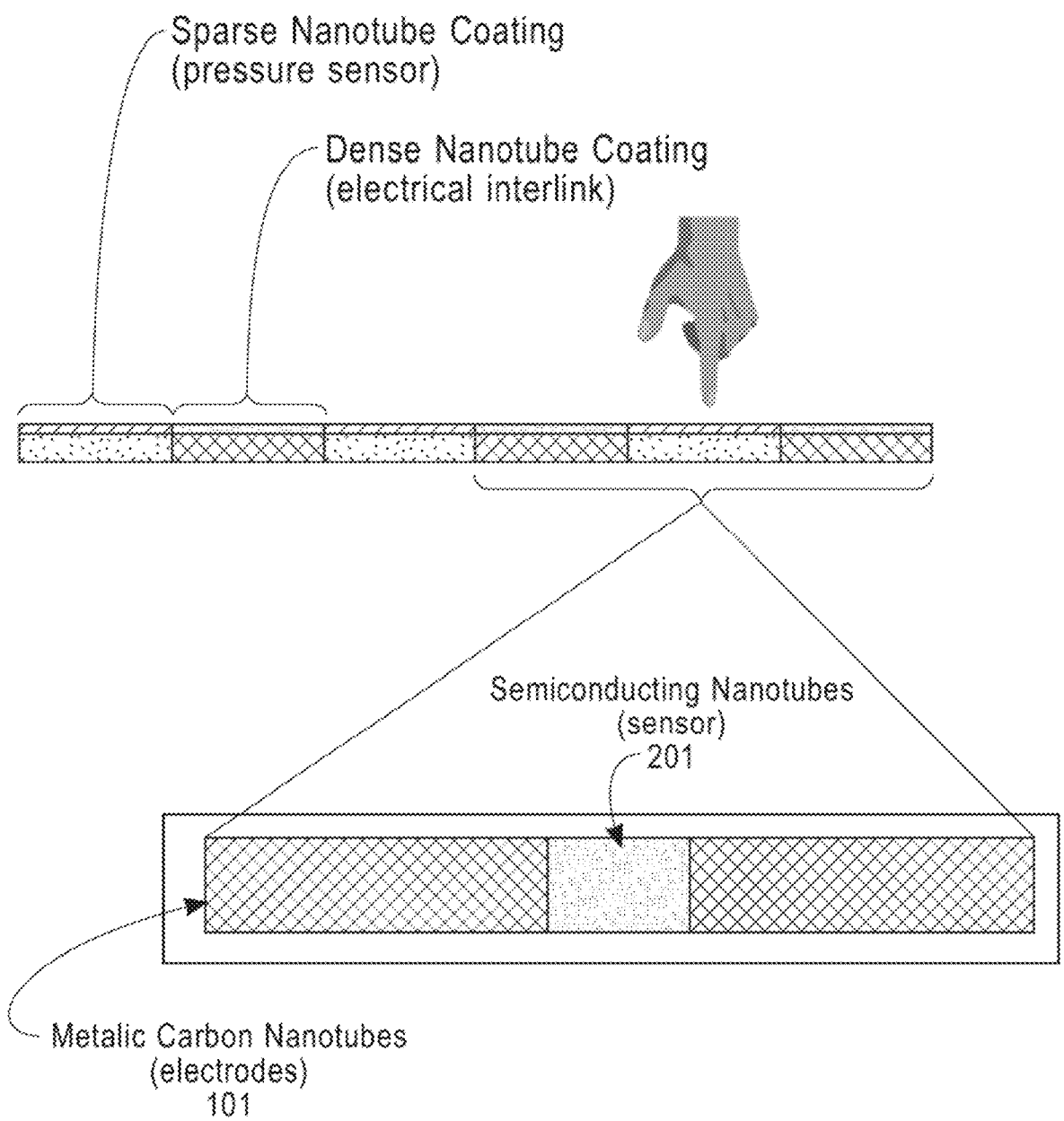
FIG. 5 illustrates a piezoresistive input device according to an exemplary embodiment of the present invention.

FIG. 5 illustrates a piezoresistive input device according to an exemplary embodiment of the present invention.

According to an exemplary embodiment of the present invention, the sensor described herein may be a piezoresistive input device. For example, a plurality of the second carbon nanotubes 201 (e.g., the semiconductive nanotubes) may form a piezoresistive input device. The piezoresistive device may include a relatively sparse nanotube coating on a fabric, which acts as a pressure sensor. An electrical interlink may be formed by a plurality of the first carbon nanotubes 101. The plurality of the first carbon nanotubes 101 in the electrical interlink may be a relatively densely packed nanotube coating on a fabric. A current or detection signal may be applied to a processing unit described below in more detail in response to the piezoresistive input device detecting the desired stimulus.

Figure 6:
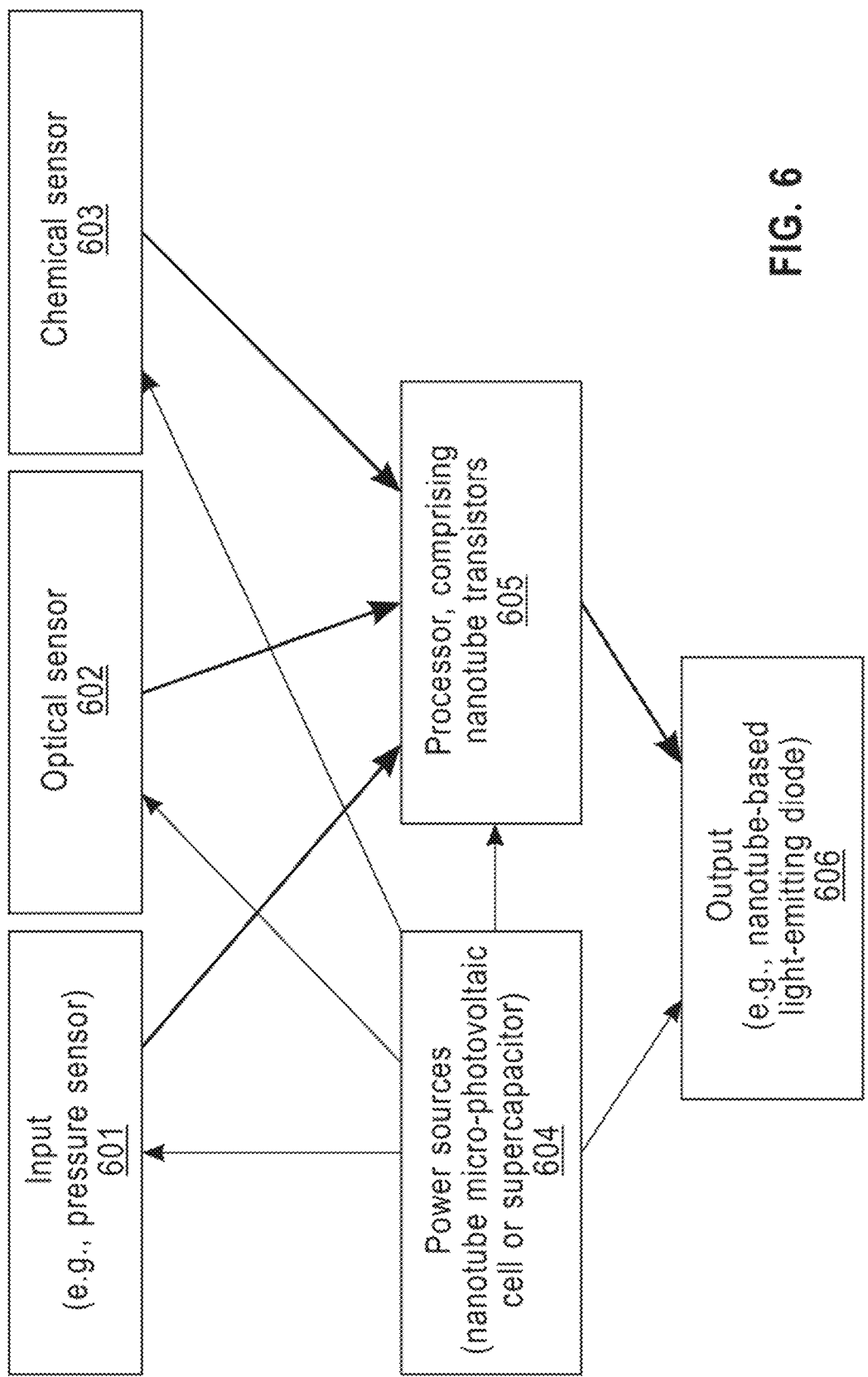
FIG. 6 illustrates a flowchart of electrical components of a wearable smart garment according to an exemplary embodiment of the present invention.

FIG. 6 illustrates a flowchart of electrical components of a wearable smart garment according to an exemplary embodiment of the present invention.

According to an exemplary embodiment of the present invention, a wearable smart device may include one or more sensors. The one or more sensors may include an input 601 (e.g., a pressure sensor), an optical sensor 602 and/or a chemical sensor 603. Each of the sensors may be connected with a power source 604 (e.g., a photovoltaic cell or a capacitor such as a super capacitor formed of a plurality of CNTs, as described herein). Each of the sensors may be connected with a processor 605 (e.g., a processor including a plurality of nanotube transistors, as described herein). Power output from the power source 604 and/or signals output from the processor 605 may be transmitted to an output module 606 (e.g., a nanotube-based light-emitting diode).

Figure 7:
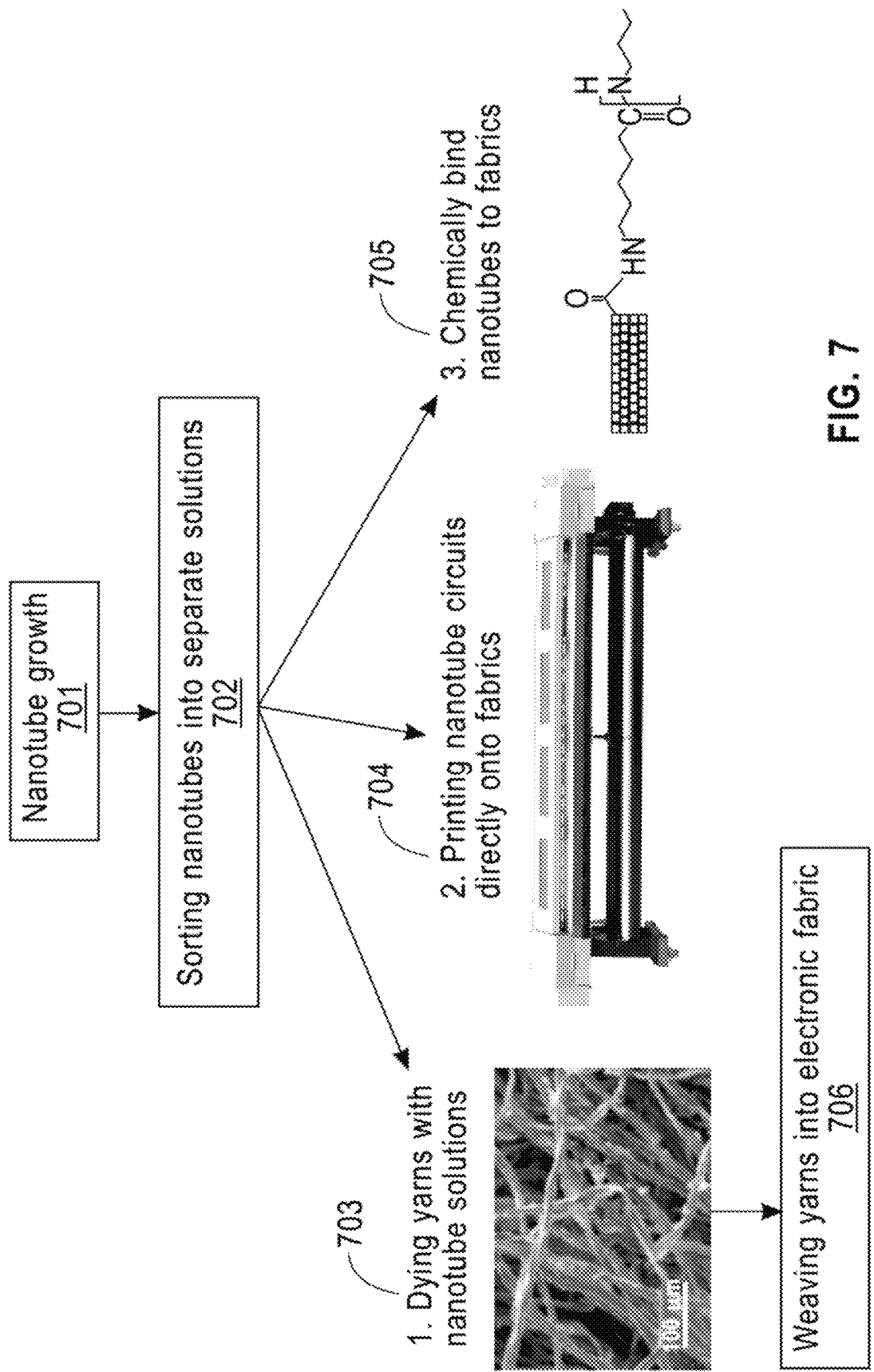
FIG. 7 illustrates an exemplary method of coupling carbon nanotubes to fabrics according to an exemplary embodiment of the present invention.

FIG. 7 illustrates an exemplary method of coupling carbon nanotubes to fabrics according to an exemplary embodiment of the present invention.

According to an exemplary embodiment of the present invention, a method of coupling carbon nanotubes to fabrics may including nanotube growth (step 701), sorting nanotubes into separate solutions (step 702) and applying the sorted nanotubes to one or more fabrics. The separate solutions, as discussed below in more detail, may be substantially purified solutions including only one type of CNT (e.g., metallic or semiconductive CNTs). For example, the sorted CNTs may be applied to yarns by dying the yarns with one of the nanotube solutions (step 703). Alternatively, the sorted CNTs may undergo a process of printing nanotube circuits directly onto fabrics (step 704), or the sorted CNTs may undergo a process to chemically bind the nanotubes to fabrics (step 705). An exemplary chemical attachment scheme for chemically bonding CNTs with fabrics is discussed below in more detail.

According to an exemplary embodiment of the present invention, the method of printing nanotube circuits directly onto fabrics (step 704) may be used to generate relatively complex patterns of CNTs in fabrics. For example, different combinations of circuits formed of groups of CNTs may be printed directly into fabrics to form the electrical components (e.g., sensors, photovoltaic cells and transistors described herein).

According to an exemplary embodiment of the present invention, the dyed yarns may undergo a process of weaving the yarns into electronic fabrics (step 706). One or more of the fabrics may be combined to form a smart garment, as described herein.

An exemplary method for sorting nanotubes and creating fabrics including nanotubes is described in more detail below.

Figure 8:
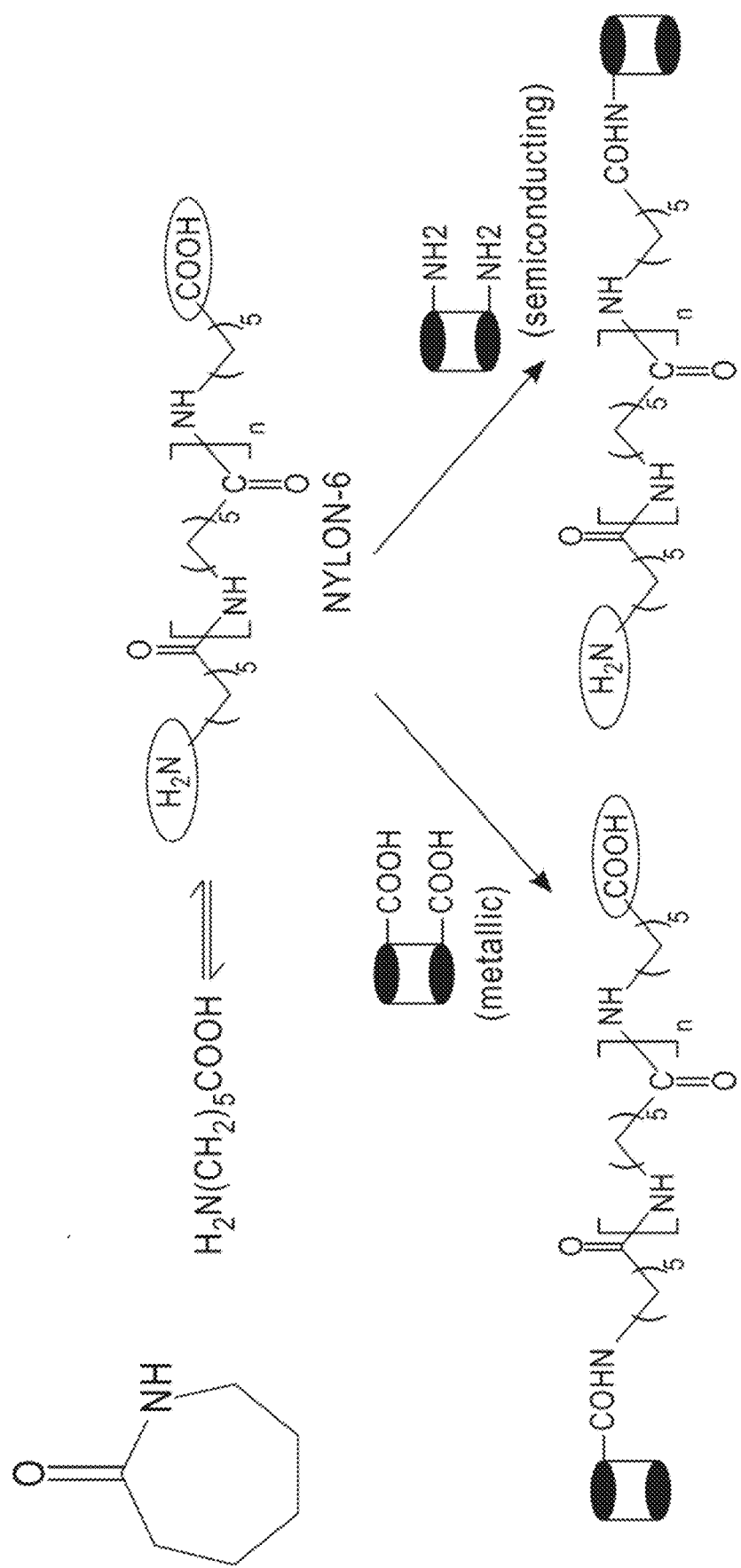
FIG. 8 illustrates an exemplary chemical attachment scheme for coupling carbon nanotubes to fabrics according to an exemplary embodiment of the present invention.

FIG. 8 illustrates an exemplary chemical attachment scheme for coupling carbon nanotubes to fabrics according to an exemplary embodiment of the present invention.

Referring to FIGS. 1, 2 and 8, according to an exemplary embodiment of the present invention, a textile article may include the first fabric 100 including a first yarn. The first yarn may include a plurality of first carbon nanotubes 101 having a first electrical conductivity coupled to the first yarn through van der waals forces. The second fabric 200 may include a second yarn. The second yarn may include a plurality of second carbon nanotubes 201 having a second electrical conductivity coupled to the second yarn through van der waals forces. The first electrical conductivity of the first carbon nanotubes 101 may be different from the second electrical conductivity of the second carbon nanotubes 201. The first fabric 100 may be interconnected with the second fabric 200. All of the features described above with reference to FIGS. 1-7 are available to the exemplary textile article described with reference to FIGS. 1, 2 and 8.

Referring to FIG. 8, chemical binding of CNTs can be achieved using synthetic chemistry. For example, NYLON-6 fiber can be functionalized with caprolactum. The end groups could be functionalized with amine and an acid. These functional groups can then be utilized to incorporate carbon fiber nanotubes in a controlled fashion. Similar approaches may be applied for other textile fibers.

For example, the method described above with reference to FIG. 8 may be applied to textile fibers such as cotton, silk, rayon, or polyester.

According to an exemplary embodiment of the present invention, the CNTs may also be functionalized with amino or carboxyl groups using known processes.

According to an exemplary embodiment of the present invention, the first yarn may be dyed with a first carbon nanotube solution including the first carbon nanotubes 101, the second yarn may be dyed with a second carbon nanotube solution including the second carbon nanotubes 201. An exemplary fabrication method applicable to, for example, coupling carbon nanotubes with yarns, fabrics or textiles described herein, is described below in more detail.

Exemplary Fabrication Method for Sorting Nanotubes and Creating Fabrics Including Nanotubes A powder of unsorted nanotubes is purified in toluene solvent. Commercially available aromatic polymers which are selective for a specific diameter or chiral angle selectively wrap around only certain chiralities of nanotubes in the solvent (e.g., metallic vs. semiconductive carbon nanotubes). Thus, only nanotubes with these certain chiralities become suspended in the solution. This ability to select nanotubes with a certain chirality translates into the ability to select nanotubes of a certain type (metallic vs. semiconducting). Thus, separate purified solutions including only metallic or semiconducting carbon nanotubes can be generated.

Sheets (or spools) of cotton are introduced to one of the purified solutions. As the cotton soaks in the solutions, the nanotubes wrap around the cotton fibers and adhered due to the strong Van der Waals forces. After 5 minutes the sheets of cotton are removed, and dried them with a nitrogen air gun. The cotton fabrics are washed in water, and re-dried them with nitrogen. The metallic nanotube fabric may be black and the semiconducting nanotube fabric may be red, the same color as the respective solutions.

Sheet conductivity of the films is measured using a Signatone four-point probe measurement system. Electrical currents in the microamp to milliamp range are provided with a Keithley programmable current source, and the voltage across the sheets is measured with a Keithley voltmeter. A substantially linear current-voltage characteristic may be observed.

The semiconducting nanotube fabric may be observed to have a sheet resistivity of 1 Mohm/square, and the metallic nanotube fabric may be observed to have a sheet resistivity of 12 kOhm/square. The higher resistivity of the semiconducting nanotube fabric may be due to the lower free charge density in the semiconducting nanotubes. Conductance across two sides of the fabric may be observed to detect penetration of the carbon nanotubes completely through the fabric. Substantially equal conductance measurements on opposite sides of the fabric indicate that the fabric has been substantially saturated. Alternatively, conductance observed on only one surface of the fabric indicates that only a film has been formed on the fabric, without fully penetrating the fabric.

While the present invention has been particularly shown and described with reference to exemplary embodiments thereof, it will be understood by those of ordinary skill in the art that various changes in form and detail may be made therein without departing from the spirit and scope of the present invention as defined by the following claims.

The invention claimed is:

1. A method of coupling carbon nanotubes (CNTs) to fabrics, comprising the steps of:
   growing a plurality of CNTs having different electrical conductivities;
   sorting the CNTs into a plurality of separate solutions using solvents that are selective for each CNT;
   applying the plurality of sorted CNT solutions onto a plurality of fabrics, and
   weaving the fabrics together.

2. The method of claim 1, wherein the CNTs include metallic CNTs and semiconducting CNTs.

3. The method of claim 1, wherein applying the plurality of sorted CNT solutions onto a plurality of fabrics comprises:
   dying yarns with the CNT solutions, wherein a first yarn is dyed with a first CNT solution that includes first CNTs having a first electrical conductivity, and a second yarn is dyed with a second CNT solution that includes second CNTs having a second electrical conductivity; and
   weaving the dyed yarns into electronic fabrics, wherein first yarns dyed with the first CNT solution are woven into a first electronic fabric, and second yarns dyed with the second CNT solution are woven into a second electronic fabric.

4. The method of claim 3, further comprising combining one or more of the plurality of fabrics into a smart garment.

5. The method of claim 1, wherein applying the plurality of sorted CNT solutions onto a plurality of fabrics comprises printing a CNT solution directly onto a fabric wherein circuits of CNTs are generated in the fabric.

6. The method of claim 5, wherein the circuits include a photovoltaic cell, a sensor, a transistor or a capacitor.

7. The method of claim 1, wherein applying the plurality of sorted CNT solutions onto a plurality of fabrics comprises chemically binding nanotubes in a CNT solution onto a fabric by introducing a sheet of fabric into the CNT solution wherein the nanotubes wrap around fabric fibers and adhere due to Van der Waals forces.

8. The method of claim 7, wherein applying the plurality of sorted CNT solutions onto a plurality of fabrics further comprises:
   removing the fabric sheet from the solution after a predetermined period of time;
   drying the fabric sheet with a nitrogen air gun;
   washing the fabric sheet in water;
   re-drying the fabric sheet with the nitrogen air gun; and
   measuring conductance across two sides of the fabric sheet to detect penetration of the CNTs through the fabric sheet, wherein substantially equal conductance measurements on opposite sides of the fabric sheet indicates that the fabric sheet has been substantially saturated, and conductance observed on only one surface of the fabric sheet indicates that a film has been formed on the fabric without fully penetrating the fabric.

9. A method of coupling carbon nanotubes (CNTs) to fabrics, comprising the steps of:
   dying a plurality of yarns with one or more of a plurality of CNT solutions, wherein a first yarn is dyed with a first CNT solution that includes first CNTs having a first electrical conductivity, and a second yarn is dyed with a second CNT solution that includes second CNTs having a second electrical conductivity which is different than the first conductivity; and
   weaving the dyed yarns into electronic fabrics, wherein first yarns dyed with the first CNT solution are woven into a first electronic fabric, and second yarns dyed with the second CNT solution are woven into a second electronic fabric.

10. The method of claim 9, further comprising combining one or more of the plurality of fabrics into a smart garment.

11. The method of claim 9, wherein CNT types include metallic CNTs and semiconducting CNTs.

* * * * *